United States Patent
Tong

(10) Patent No.: US 9,287,008 B2
(45) Date of Patent: Mar. 15, 2016

(54) CIRCUIT AND METHOD FOR CONTROLLING INTERNAL TEST MODE ENTRY OF AN ASRAM CHIP

(71) Applicant: Integrated Silicon Solution (Shanghai), Inc, Shanghai (CN)

(72) Inventor: Mingzhao Tong, Shanghai (CN)

(73) Assignee: INTEGRATED SILICON SOLUTION (SHANGHAI), INC., Pudong New Area, Shanghai (CN)

( * ) Notice: Subject to any disclaimer, the term of this patent is extended or adjusted under 35 U.S.C. 154(b) by 189 days.

(21) Appl. No.: 14/096,033

(22) Filed: Dec. 4, 2013

(65) Prior Publication Data

US 2015/0155056 A1 Jun. 4, 2015

(51) Int. Cl.
*G11C 29/46* (2006.01)
*G11C 29/18* (2006.01)

(52) U.S. Cl.
CPC ...................................... *G11C 29/46* (2013.01)

(58) Field of Classification Search
CPC ... G01R 31/31701; G11C 29/46; G11C 29/18
USPC .................................. 714/718, 719; 365/201
See application file for complete search history.

(56) References Cited

U.S. PATENT DOCUMENTS 5,950,145 A * 9/1999 Roohparvar ................... 702/109
7,624,315 B2 * 11/2009 Mysliwitz .............. G11C 29/48
365/201

* cited by examiner

*Primary Examiner* — Phung M Chung
(74) *Attorney, Agent, or Firm* — Jun He Law Offices P.C.; Zhaohui Wang

(57) ABSTRACT

A circuit and method for controlling internal test mode entry of an Asynchronous Static Random Access Memory (AS-RAM) chip wherein the circuit includes an address code comparator for detecting whether address codes inputted via an address bus of the ASRAM chip match a predefined validation code; a test mode detector for determining whether to let the ASRAM chip enter into an internal test mode; a test mode clock generator for generating a clock signal for the test mode decoder; and a test mode decoder for generating a test control signal. The circuit of the present application uses the existing pins of the ASRAM chip to input a special section of codes to trigger the ASRAM to enter into its internal test mode, thereby reducing the difficulty of testing the products.

10 Claims, 13 Drawing Sheets

US 9,287,008 B2

CIRCUIT AND METHOD FOR CONTROLLING INTERNAL TEST MODE ENTRY OF AN ASRAM CHIP

FIELD OF THE INVENTION

The present application relates to a circuit and method for controlling internal test mode entry of a memory, particularly a circuit and method for controlling internal test mode entry of an Asynchronous Static Random Access Memory (AS-RAM) chip.

BACKGROUND OF THE INVENTION

Some circuits used for internal test mode are provided in the semiconductor memory circuit design. These circuits are transparent to users and may never be used in normal applications. However, the circuits can be used to adjust the internal circuit timing and internal voltages, to change the internal control logic, or for other specific purposes. In consideration of the usages of the test circuits, they are required to have the following two features: firstly, the test circuits should not enter into the test mode during users' normal (valid) operations; secondly, the test circuits should be capable of entering into the test mode during the product development and test procedures. Therefore, it is usual to use extra pins to input and output signals of the test circuit, which are grounded (i.e. in the disabled state) during the normal operations. Sometimes, a specific section of code is added into a clock signal for the chip to control the test circuit, and the users are restricted from using the section of code as defined in the product datasheet.

Regarding an ASRAM product, the aforementioned method can not be used due to some specific features of the ASRAM product. Firstly, the ASRAM is a generic product having a common package, i.e. products from different companies use exactly the same package, thus no extra pins can be used for the test mode. Secondly, the ASRAM operates in an asynchronous manner, therefore it does not have an external clock. Thirdly, there are various applications of the ASRAM, it is improper to restrict the users from using a specific section of code in the product datasheet, otherwise the compatibility of the generic ASRAM product may be adversely affected.

Therefore, a previously used method for control the test mode entry of the ASRAM product is to apply a super-high input high (SVIH) voltage at one or more pins of the ASRAM product and maintain the SVIH voltage for a period of time to trigger its internal test circuit. The term SVIH indicates a voltage being an extra value higher than the supply voltage. For example, for a 3.3V ASRAM, the SVIH voltage of 3.3V+ 0.7V is applied at the pins thereof. Under normal conditions, the pins of the ASRAM will not be applied of any voltage higher than the supply voltage $V_{cc}$ of the ASRAM, and the voltage $V_{ih}$ (the input high voltage applied at the pins) defined in the datasheet is lower than or equal to the supply voltage $V_{cc}$. The purpose of maintaining the SVIH voltage for a period of time (for example, 100 ns) is to avoid incorrectly triggering the test circuit due to some glitches at the pins.

Although the method works, it still has some drawbacks. Firstly, the voltages at some pins are required to be higher than the supply voltage $V_{cc}$. An Electro-Static Discharge (ESD) protection circuit is generally coupled to the pins, which may comprise a pair of reversely biased diodes. When the voltage at the pins is higher than the supply voltage $V_{cc}$, the diodes may be turned on to generate a current flowing from the pins to the supply voltage $V_{cc}$. Secondly, during the design of the circuit, the SVIH voltage may sometimes be designed a bit higher, such as $V_{cc}$+1.5V, to provide some design margin and to enable the circuit to operate under a low supply voltage. However, during the actual test procedures, because of the deviations of the chips and the working conditions, such as deviations of the process/voltage/temperature (PVT), the test platform may apply a much higher SVIH voltage to ensure that every tested chip enters into the test mode. For example, the SVIH voltage may be 6V when the supply voltage $V_{cc}$ is 4V. Such high SVIH voltage is close to the breakdown voltage of the transistors manufactured in some processes, which is extremely harmful to the chips. Thirdly, it is generally required to perform some complicated function test to the ASRAM when the ASRAM enters into and remains in some test mode. The $V_{ih}$ configuration of the pins can not be changed in line in some old test platforms, or the old test platforms cannot provide several different groups of $V_{ih}$ configurations.

SUMMARY OF THE INVENTION

The technical problem to be solved by the present application is to provide a circuit and method for controlling internal test mode entry of an ASRAM chip, which is capable of using the existing pins of the ASRAM chip to let the ASRAM chip enter into the internal test mode.

To solve the aforementioned technical problem, in an aspect of the present application, there is provided a circuit for controlling internal test mode entry of an ASRAM chip. The circuit comprises an address code comparator, a test mode detector, a test mode clock generator and a test mode decoder.

The address code comparator is configured to detect whether address codes on an address bus of the ASRAM chip matches a predefined validation code.

The test mode detector is configured to determine whether to let the ASRAM chip enter into an internal test mode according to an input signal at a write enable pin of the ASRAM chip, an input signal at an output enable pin of the ASRAM chip and an output signal of the address code comparator, wherein the ASRAM chip enters into the internal test mode if two or more consecutive falling edges are detected in the input signal at the output enable pin, and the address codes on the address bus are detected to match the predefined validation code at each of the two or more falling edges, when the input signal at the write enable pin is at a low level.

The test mode clock generator is configured to generate a clock signal for the test mode decoder according to an output signal of the test mode detector and the input signal at the output enable pin.

The test mode decoder is configured to generate a test control signal according to the output signal of the test mode detector, the clock signal outputted by the test mode clock generator and the input signal on the address bus.

The circuit for controlling internal test mode entry of the present application uses the existing pins of the ASRAM chip to input a special section of codes to trigger the ASRAM chip to enter into its internal test mode, thereby reducing the difficulty of testing the ASRAM chips. Moreover, according to the truth table for the chip, when the input at the WEB (write enable) pin is at the low level, the chip will work in the write cycle and the JO pin (Input/Output pin) serves as a data input pin, no matter whether the input at the OEB (output enable) pin is at the high level or at the low level. When the input at the WEB pin is at the high level (i.e. in the read cycle) and the input at the OEB pin is at the low level, data will be outputted at the IO pin. Thus, during the write cycle when the WEB pin is at the low level, the OEB pin will maintain at the high level or at the low level and will not toggle. Therefore, there will not be two consecutive falling edges at the OEB pin. Further-more, the specific validation code is arranged on the address bus, thus the possibility of entering into the test mode due to an incorrect user's operation will be significantly reduced, nearly reduced to zero.

In another aspect of the present application, there is provided a method for controlling internal test mode entry of an ASRAM chip. The method comprises:

Step 1: when an input signal at a write enable pin of the ASRAM chip is at a low level, if two or more consecutive falling edges are detected in an input signal at an output enable pin and the corresponding address codes are continuous on an address bus, and the address codes on the address bus are detected to match a validation code predefined in the ASRAM chip at each of the two or more falling edges, setting an enabling signal for the internal test mode to activate and an internal test mode window to open; and Step 2: when the input signal at the write enable pin is at the low level, storing a test mode code on the address bus and triggering the ASRAM chip into the test mode according to the test mode code at a subsequent rising edge inputted at the read enable pin.

BRIEF DESCRIPTION OF DRAWINGS

The present application will be elaborated with reference to the accompanying drawings and the detailed description of the embodiments.

DETAILED DESCRIPTION OF THE INVENTION

Figure 1:
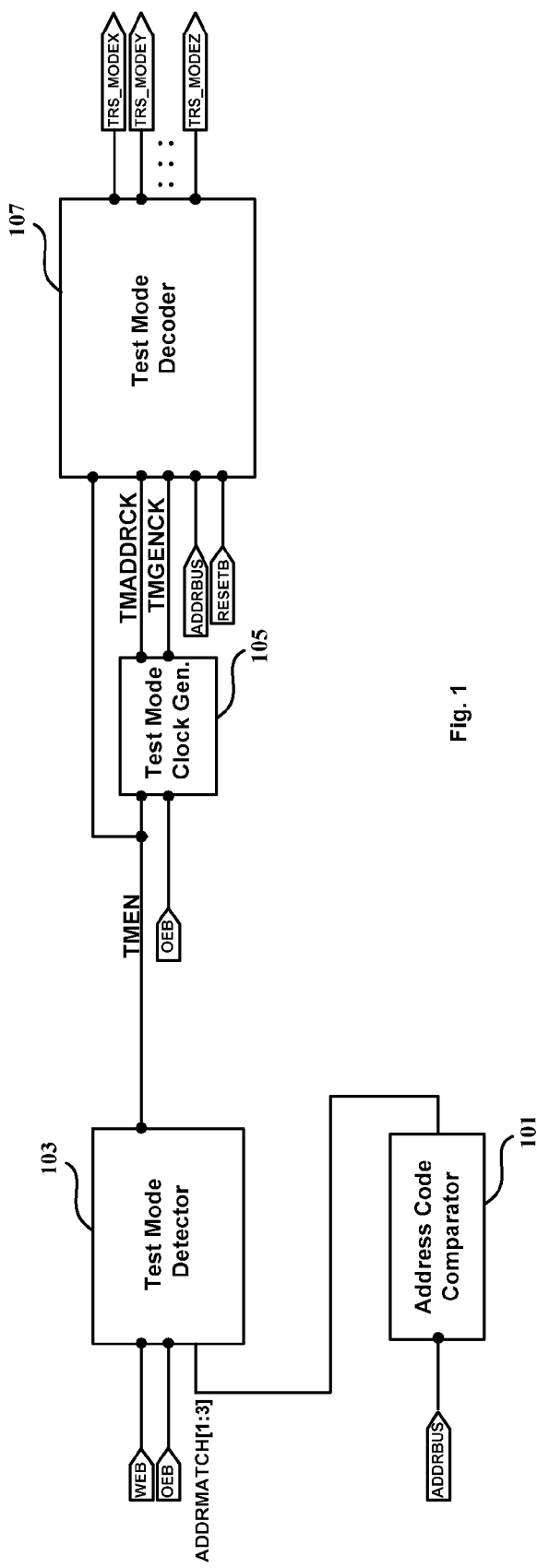
FIG. 1 shows a block diagram of a circuit for controlling internal test mode entry of an ASRAM chip according to the present application.

FIG. 1 shows a block diagram of a circuit for controlling internal test mode entry of an ASRAM chip according to the present application.

As shown in FIG. 1, the circuit comprises an address code comparator 101, a test mode detector 103, a test mode clock generator 105 and a test mode decoder 107. The address code comparator 101 is configured to receive an input signal on an address bus (i.e. an address pin), and to detect whether address codes on the address bus match a predefined validation code. The test mode detector 103 is configured to receive an input signal at a write enable (WEB) pin and an output signal of the address code comparator 101, so as to detect whether the address codes match the predefined validation code at two or more consecutive falling edges inputted at the WEB pin. Generally, if the address codes match the predefined validation code at the two or more consecutive falling edges, a TMEN (test mode enable) signal at a high level will be outputted by the test mode detector. The test mode clock generator 105 is configured to receive an input signal at an OEB pin and the TMEN signal simultaneously, and to generate a clock signal for the test mode decoder 107. The test mode decoder 107 is configured to receive the clock signal outputted by the test mode clock generator 105, the TMEN signal and the signal (i.e. the address codes) inputted at the address pin; to store the address codes on the address bus at the following rising edges of the input signal at the OEB pin, and to generate a test mode control signal.

The above circuit enters into the internal test mode of the ASRAM chip through two steps (see FIG. 13):

Step 1, when the input signal at the write enable pin (i.e. the WEB pin, and the input signal at this pin is referred to as the WEB signal) is at the low level, if two or more consecutive falling edges are detected in the input signal at the output enable pin (i.e. the OEB pin, and the signal inputted at this pin is referred to as the OEB signal) and corresponding address codes are continuous on the address bus, and the address codes on the address bus are detected to match the validation code pre-stored in the ASRAM chip at each of the two or more falling edges, an enable signal for the internal test mode is set to be active to open an internal test mode window.

Step 2, at a subsequent rising edge inputted at the OEB pin, a test mode code on the address bus is latched up, and the ASRAM chip is triggered into a specific test mode according to the test mode code.

Figure 13:
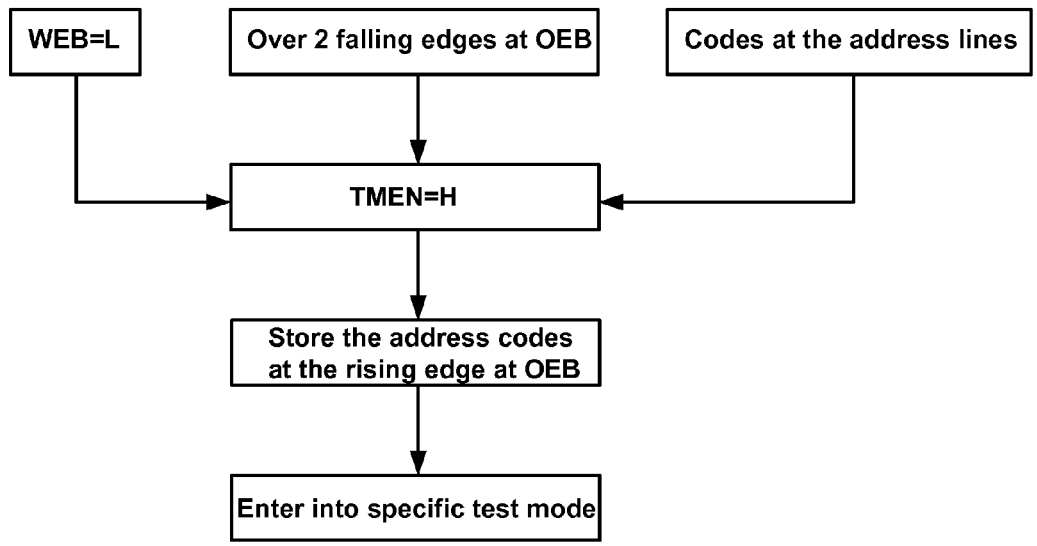
FIG. 13 shows a flow chart of a method according to the present application.

FIG. 13 shows a method for controlling internal test mode entry of an ASRAM chip according to an embodiment of the present application. In certain embodiments, the method can be implemented by the circuit shown in FIG. 1.

As shown in FIG. 13, the method enters into the internal test mode of an ASRAM chip through two steps:

Step 1, when an input signal at a write enable pin (i.e., the WEB pin, and the signal inputted at this pin is referred to as the WEB signal) is at the low level, if two or more consecutive falling edges are detected in the input signal at an output enable pin (i.e., the OEB pin, the signal inputted at this pin is referred to as the OEB signal) and corresponding address codes are continuously on the address bus, and the address codes on the address bus are detected to match a validation code pre-stored in the ASRAM at each of the two or more falling edges, an enable signal for the internal test mode is set to be active to open an internal test mode window.

Step 2, at a subsequent rising edge inputted at the OEB pin, a test mode code on the address bus is latched up, and the ASRAM chip is triggered into a specific test mode according to the test mode code.

Regarding the circuit and method for controlling the internal test mode entry of the ASRAM chip described above, the following points should be noted:

1) The address codes for validation on the address bus should be continuous at the falling edges of the OEB signal.

Further, these address codes for validation should be randomly defined and independent from the users.

2) The address codes for validation should appear in the same cycle as the WEB signal is at the low level ("L"). The address codes for validation should be inputted again if the WEB signal changes to the high level.

3) The WEB signal controls the termination of the internal test mode enable signal ("TMEN"). The TMEN signal will be disabled to close the internal test mode window as long as the WEB signal changes to the high level.

4) In order to reduce the possibility of entering into the test mode due to the user's mis-operation, it can be designed to detect the address codes at three or more consecutive falling edges of the OEB signal. The more the falling edges of the OEB signal are used for determining whether or not to enter into the test mode are, the more stable the circuit is. Thus, the possibility of entering into the test mode due to the user's mis-operation is reduced.

5) In order to further reduce the possibility of entering into the test mode due to the user's mis-operation, the TMEN signal can be designed to have a maximum width, which is controlled by an internal delay circuit and the WEB signal. When a low-to-high transition time of the WEB signal is greater than a delay time of the delay circuit, the width of the TMEN signal depends on the delay circuit. When the low-to-high transition time of the WEB signal is smaller than the delay time of the delay circuit, the width of the TMEN signal depends on a time predefined by the WEB signal.

Figure 2:
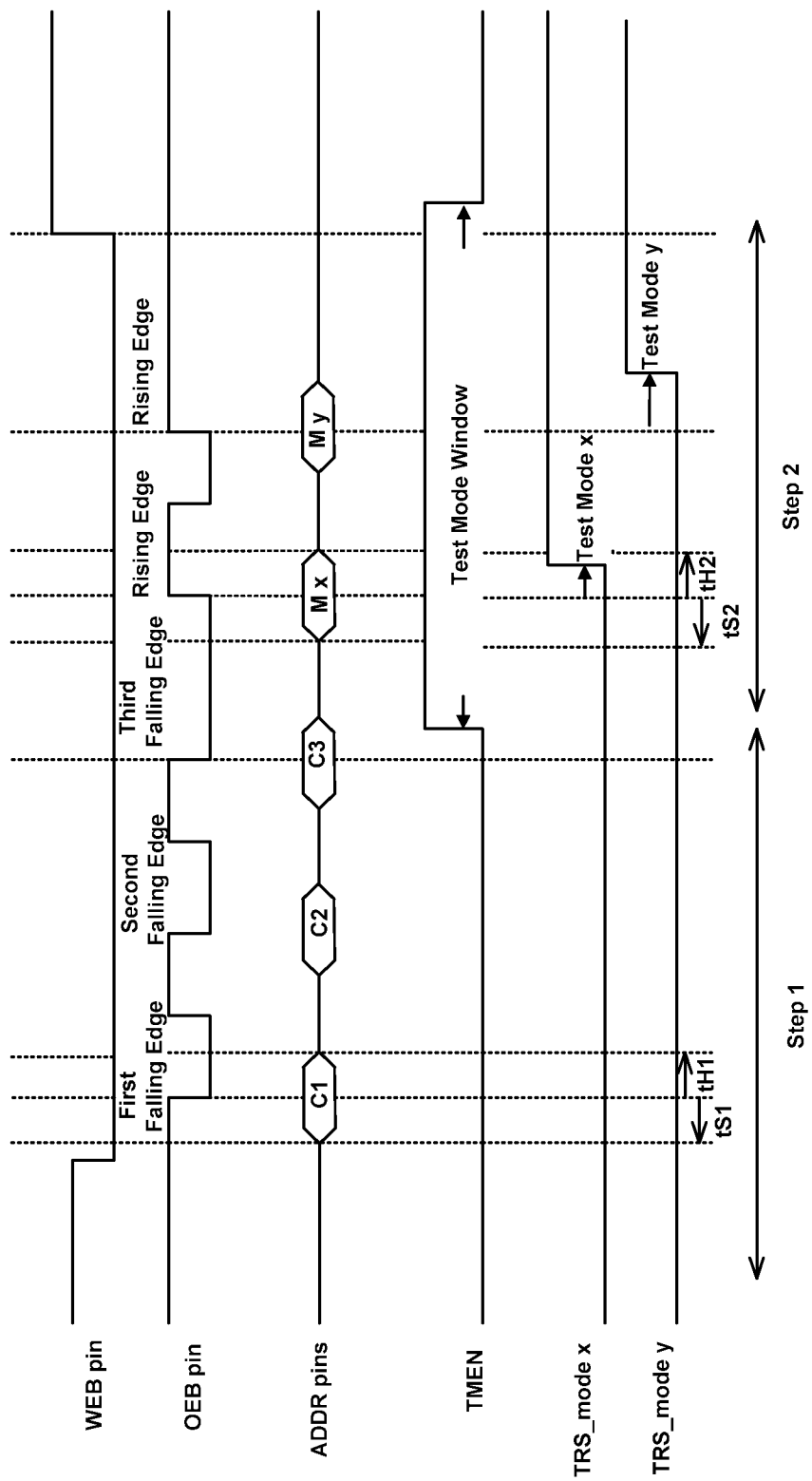
FIG. 2 shows the waveforms of signals according to an embodiment of the present application.

The embodiment shown in FIG. 2 indicates that: during the write cycle (when the WEB signal is at the low level), the OEB signal has three consecutive falling edges and three specific address codes are inputted on the address bus at the falling edges. When the specific address codes on the address bus match the pre-stored validation code, the internal test mode enable signal will be activated and the internal test mode window will be open. As the width of the TMEN signal is controlled by the WEB signal, when the WEB signal changes to the high level, the TMEN signal will be invalid and the internal test mode window will be closed.

Figure 3:
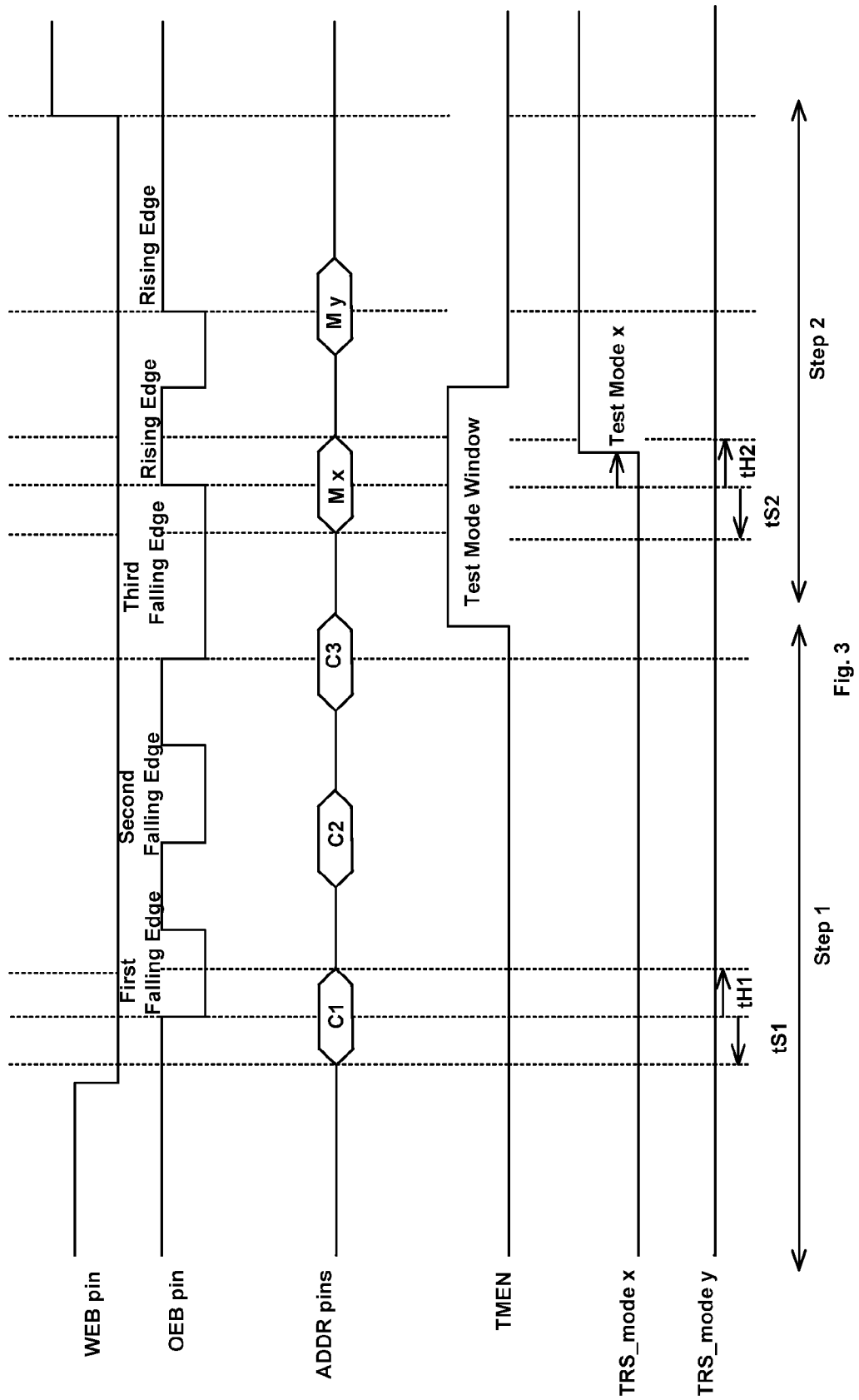
FIG. 3 shows the waveforms of signals according to another embodiment of the present application.

In the embodiment shown in FIG. 3, the TMEN signal is designated to have a maximum width being controlled by both the internal delay circuit and the WEB signal. As shown in FIG. 3, as the test mode x is within the test mode window, the ASRAM chip will enter into the test mode x. However, as the test mode y is outside the test mode window, the ASRAM chip will not enter into the test mode y.

Figure 4A:
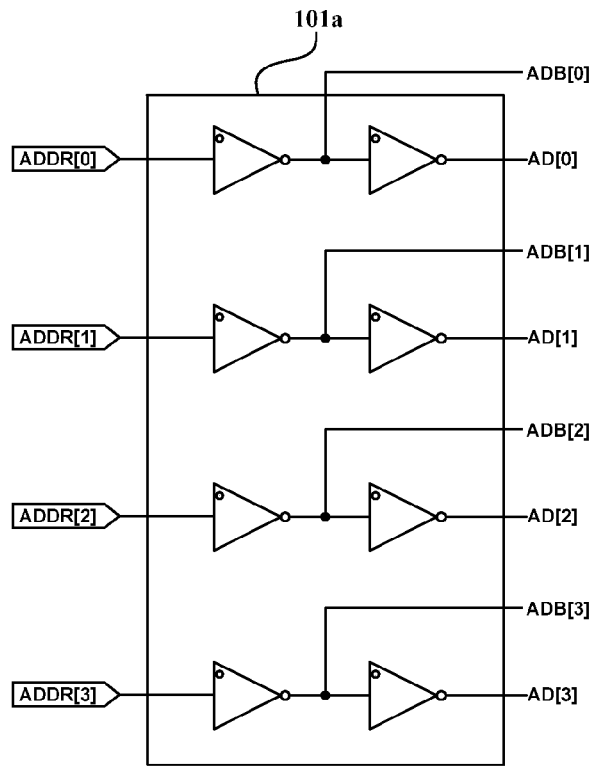
FIGS. 4(a)-(b) show an embodiment of an address code comparator in FIG. 1.
Figure 4B:
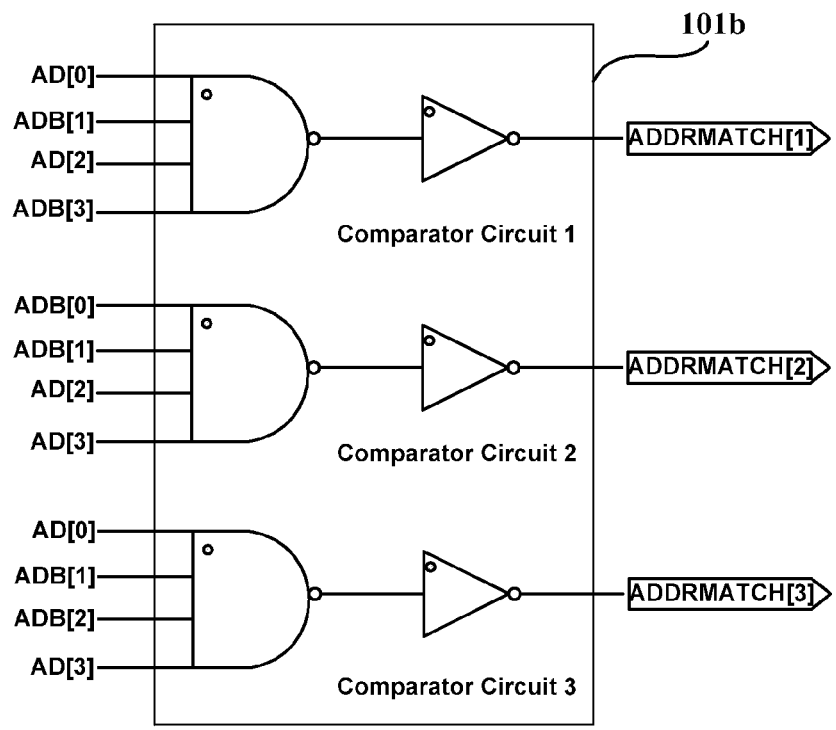

FIGS. 4(a)-(b) show an embodiment of an address code comparator with a 4-bit address shown in FIG. 1. Pins ADDR [0]-ADDR[3] 101a in FIG. 4(a) represent four address pins. When the pin ADDR[0] is 1, the output at the pin ADB[0] is 0 as an inverter is coupled between the pins ADDR[0] and ADB[0], and the output at the pin AD[0] is 1 due to another inverter coupled between the pins ADB[0] and AD[0]. FIG. 4(b) shows an address code comparator 101b defined according to the validation code. Three comparator circuits are predefined as three address codes need to be compared. Taking the comparator circuit 1 for example, its input pins are designed according to the self-defined validation code. For example, when C1 is 1010, the output at pin ADDRMACTH [1] will be equal to 1 after the computation of an NAND gate and an inverter only if the input pins include pins AD[0], ADB[1], AD[2] and ADB[3]. Similarly, when C2 is 0011, the output at the pin ADDRMACTH[2] will be 1 after the computation of an NAND gate and an inverter, only if the input pins include pins ADB[0], ADB[1], AD[2] and AD[3]. Similarly, when C3 is 1001, the output at the pin ADDRMACTH [3] will be equal to 1 after the computation of an NAND gate and an inverter only if the input pins include pins AD[0], ADB[1], ADB[2] and AD[3]. When all the outputs of the pins ADDRMATCH[1]-[3] are equal to 1, the address codes will be detected to match the validation code.

Figure 14:
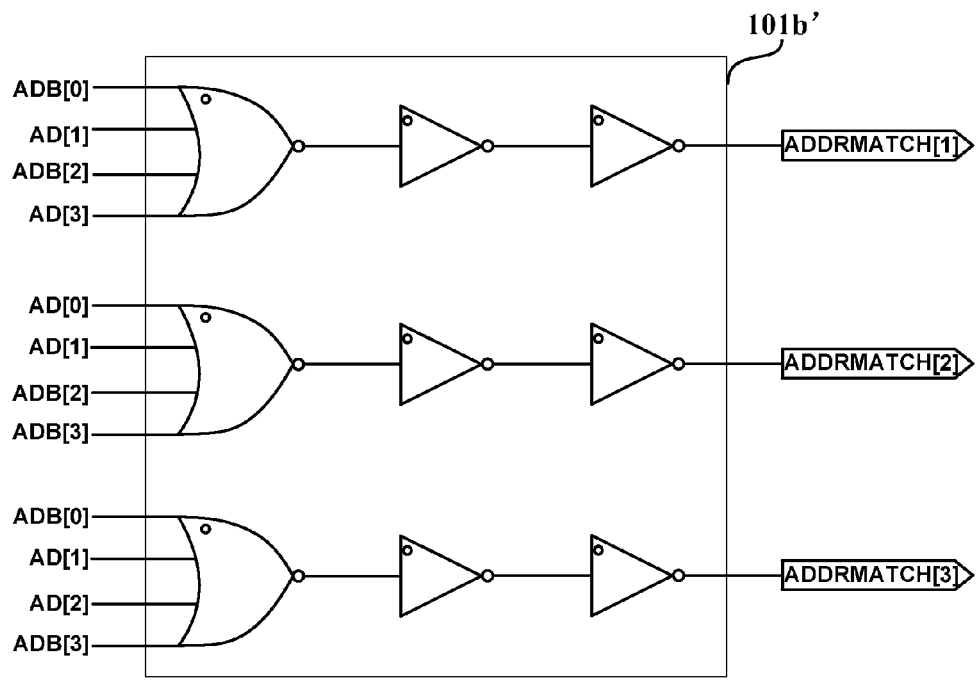
FIG. 14 shows an equivalent circuit of the circuit in FIG. 4(b)

The above circuit is merely an example of the address code comparator, other circuits capable of implementing the same function could also be used in the present application. FIG. 14 shows another comparator circuit 101b' capable of comparing the address codes on the address bus and making the output at the pins ADDRMATCH[1]-[3] to be 1. It will be appreciated that the circuits are only exemplary and not limiting. In practical applications, a 1 Mbit (64K*16) ASRAM chip has 16 address signals, therefore the address code comparator should have 16 address signal input pins ADDR[0:15], which are used for detecting whether the three address codes match the validation codes via the pins ADDRMATCH[1:3].

Figure 5:
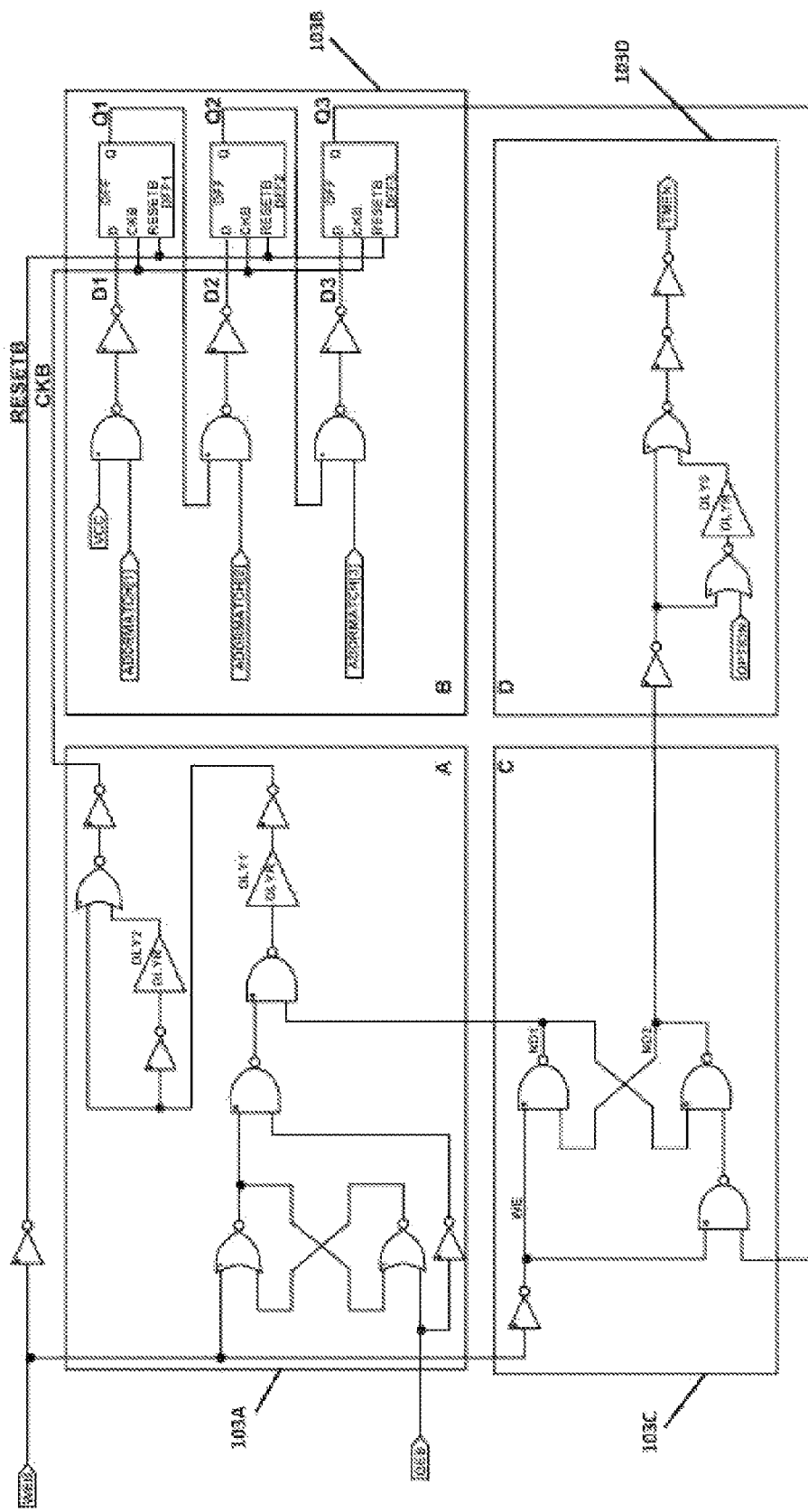
FIG. 5 shows an embodiment of a test mode detector in FIG. 1.
Figure 6:
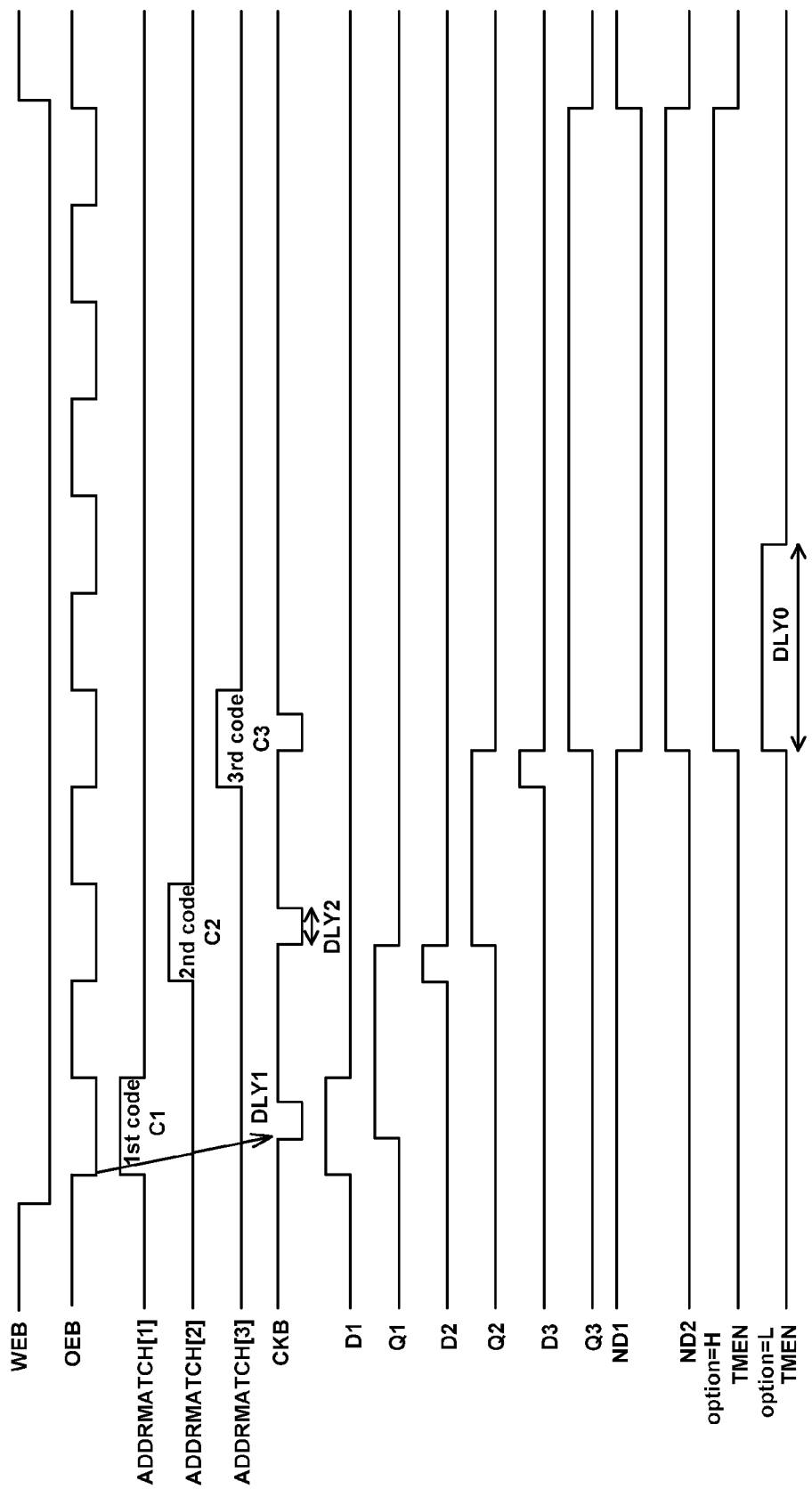
FIG. 6 shows the waveforms of signals of the test mode detector in FIG. 5.

FIG. 5 shows an exemplary circuit of the test mode detector, and FIG. 6 shows the waveform of signals of the detector. The test mode detector comprises a work clock generating module 103A, a detecting module 103B, a test mode entry module 103C and a test window determining module 103D.

The work clock generating module 103A is configured to generate a clock signal CKB as the work clock for the test mode detector according to the OEB signal when the WEB signal is at the high level. A setup time tS1 and a hold time tH1 in FIG. 2 or 3 are defined by a delay unit DLY1, and the width of the clock signal CKB is defined by a delay unit DLY2.

The detecting module 103B is configured to detect whether the address codes on the address bus match the predefined validation code at consecutive falling edges of the OEB signal according to the output signal of the address code comparator and the clock signal CKB. Specifically, the signals at the pins ADDRMACTH[1]-[3] are inputted into respective series circuits consisted of an NAND gate, an inverter and a D flip-flop; and the clock signal CKB is coupled to the CKB pins of the D flip-flops. When ADDRMATCH[1] is 1, the signal D1 outputted by the inverter is 1. Then the signal Q1 outputted by the D flip-flop DFF1 is 1 according to the signal D1 and the clock signal CKB. Afterwards, the signal D2 is 1 when ADDRMACTH[2] is 1 and Q1 is 1. Then the signal Q2 outputted by the D flip-flop DFF2 changes to 1 according to the clock signal CKB and the signal D2. Similarly, the signal D3 is 1 when ADDRMACTH[3] is 1 and Q2 is 1. Then the signal Q3 outputted by the D flip-flop DFF3 changes to 1 according to the clock signal CKB and the signal D3.

The test mode entry module 103C is configured to detect a low-to-high transition of the signal Q3. When the transition is detected, the signal ND2 will be set to the high level, and the signal ND1 will invalidate the clock signal CKB. Thus, the subsequent falling edges of the OEB signal will be invalid.

The test window determining module 103D is configured to determine a window for entering into the test mode. In the circuit shown in FIG. 5, a selecting signal can be inputted at an OPTION pin to determine if the test window has a maximum width. When the selecting signal at the OPTION pin is at the high level, the window width is determined by the WEB signal. The TMEN signal will change to the low level as long as the WEB signal changes to the high level, namely the closing of the test window depends on when the WEB signal changes to the high level. When the selecting signal at the OPTION pin is at the low level, both the WEB signal and the delay unit DLY0 determine the maximum width of the test window, which should not be higher than the delay time of the delay unit DLY0. When the low-to-high transition time of the WEB signal is bigger than the delay time of the delay unit, the test window width will be determined by the delay unit. When the low-to-high transition time of the WEB signal is smaller than the delay time of the delay unit, the test window width will be determined by the WEB signal. The delay time of the delay unit DLY0 may be predefined in the circuit.

Figure 15:
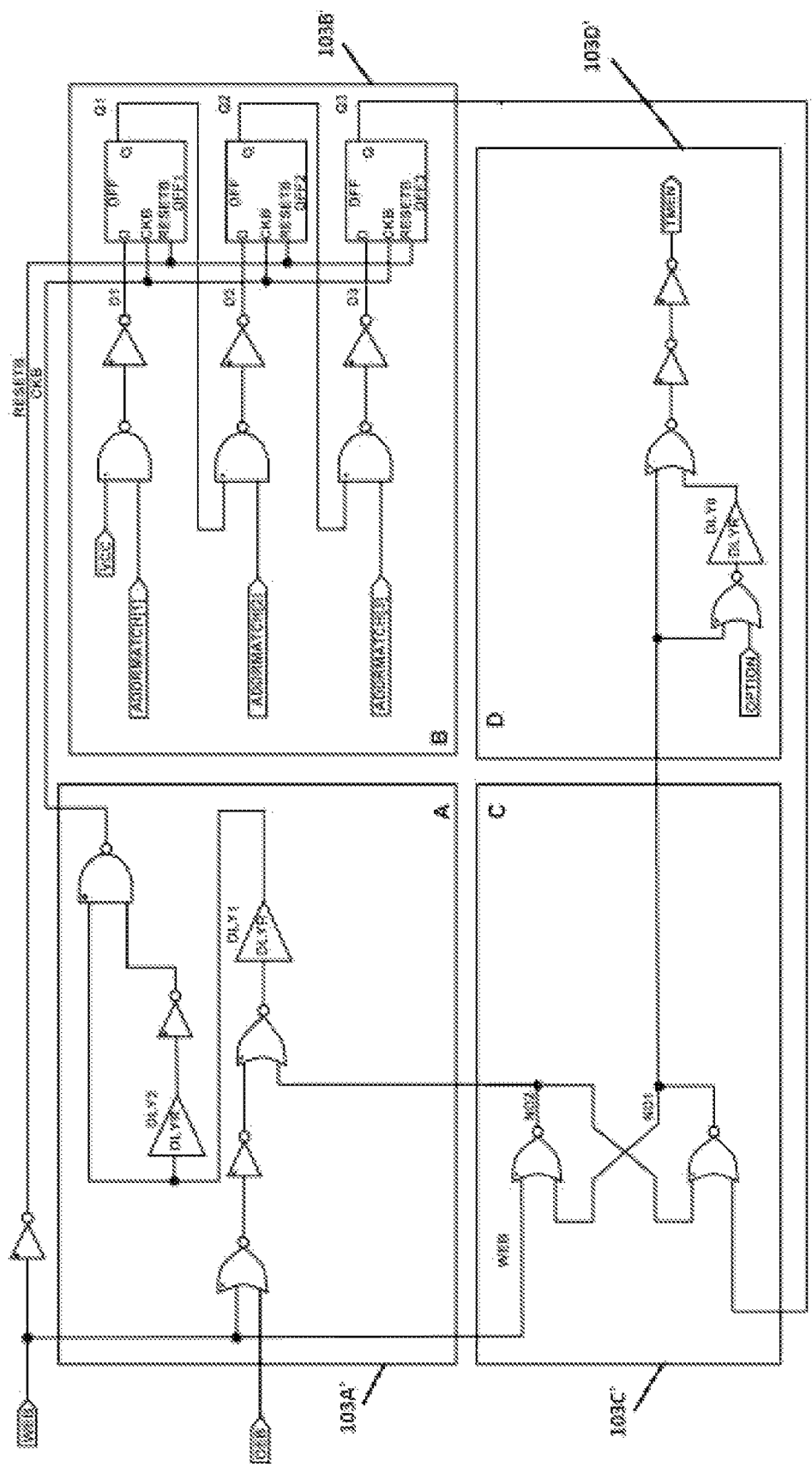
FIG. 15 shows another embodiment of the test mode detector in FIG. 1.

FIG. 15 shows another embodiment of the test mode detector shown in FIG. 1. Similarly, other test mode detectors having the same function can be used in the present application.

Figure 7:
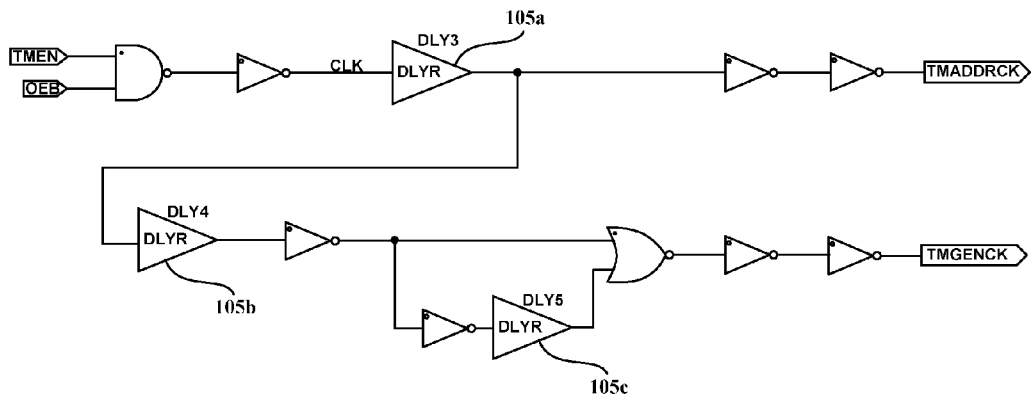
FIG. 7 shows an embodiment of a test mode clock generator in FIG. 1.
Figure 8:
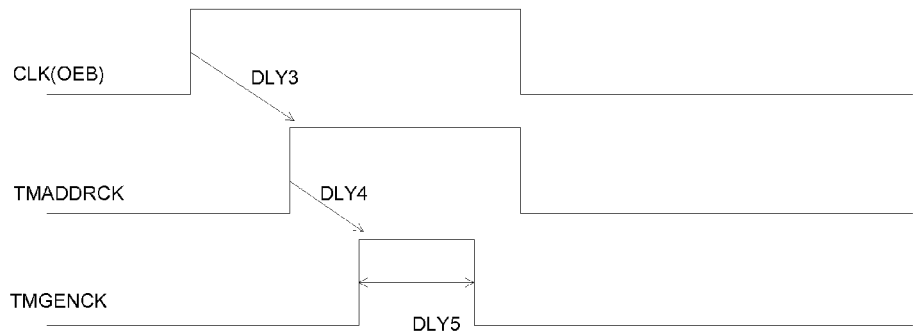
FIG. 8 shows the waveforms of signals of the test mode clock generator in FIG. 7.
Figure 16:
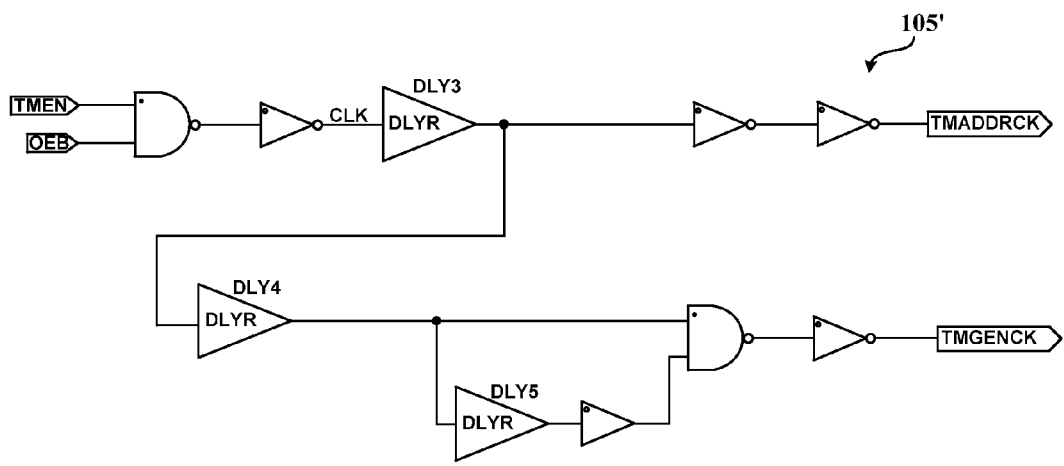
FIG. 16 shows another embodiment of the test mode clock generator in FIG. 1.

FIG. 7 shows an embodiment of the test mode clock generator in FIG. 1, wherein FIG. 8 shows the waveforms of signals of the test mode clock generator in FIG. 7. The test mode clock generator receives the TMEN signal and the OEB signal, and generates a clock signal TMADDRCK and a clock signal TMGENCK to the test mode decoder. A delay unit 105a (DLY3) in FIG. 7 defines the setup time tS2 and the hold time tH2 in FIG. 1 or FIG. 2, and delay units 105b (DLY4) and 105c (DLY5) determine relevant parameters of the clock signal TMADDRCK and TMGENCK. FIG. 16 shows another embodiment 105' of the test mode clock generator in FIG. 1.

Figure 9:
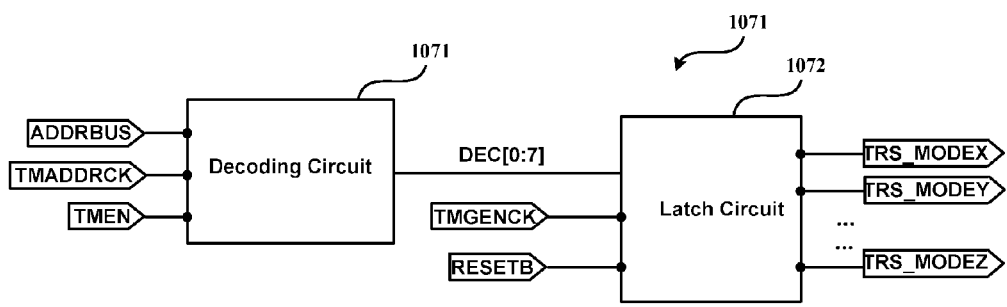
FIG. 9 shows a block diagram of an embodiment of a test mode decoder in FIG. 1.
Figure 10A:
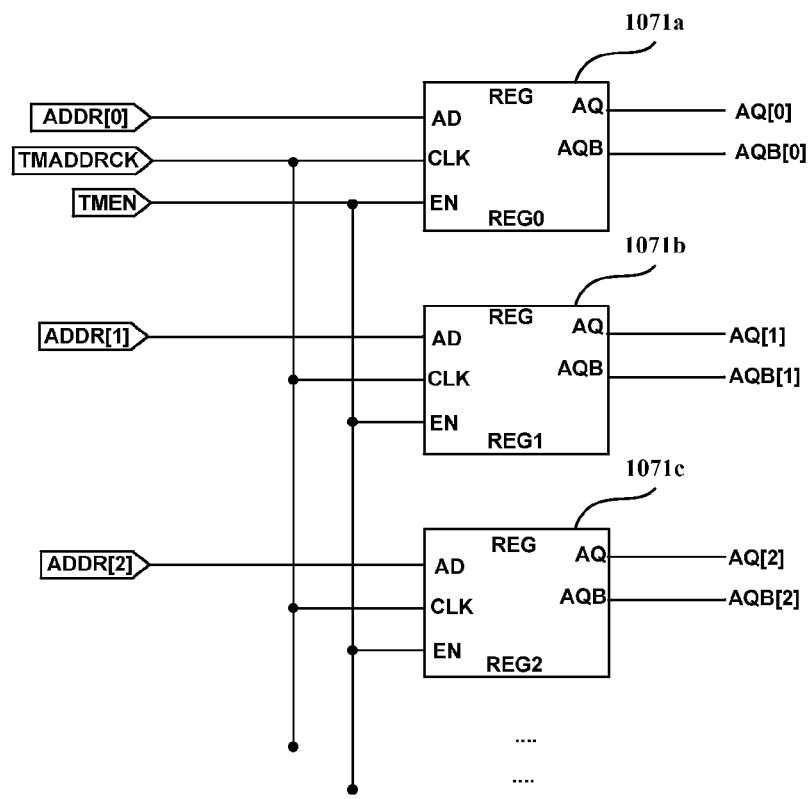
FIGS. 10(a)-10(c) show details of the decoding circuits in FIG. 9, wherein the two circuits in FIGS. 10(b) and 10(c) implement the same function.
Figure 10B:
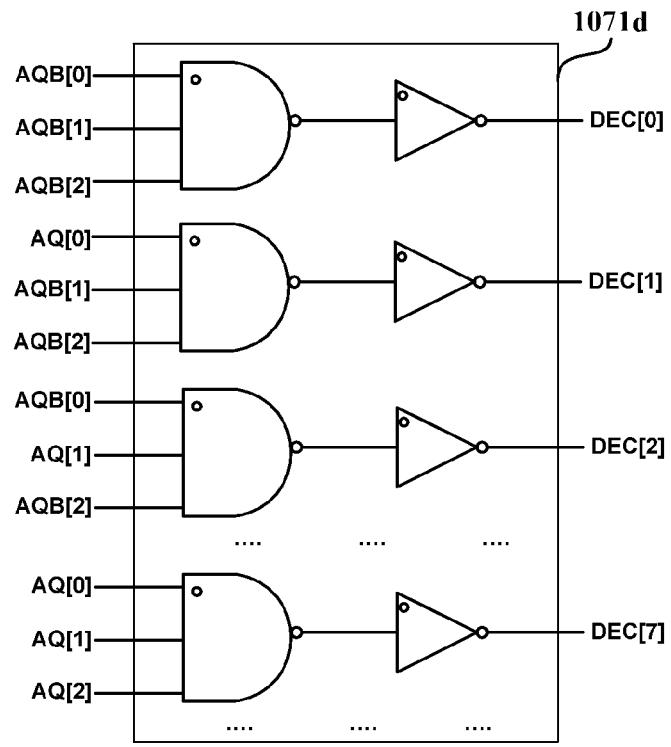
Figure 10C:
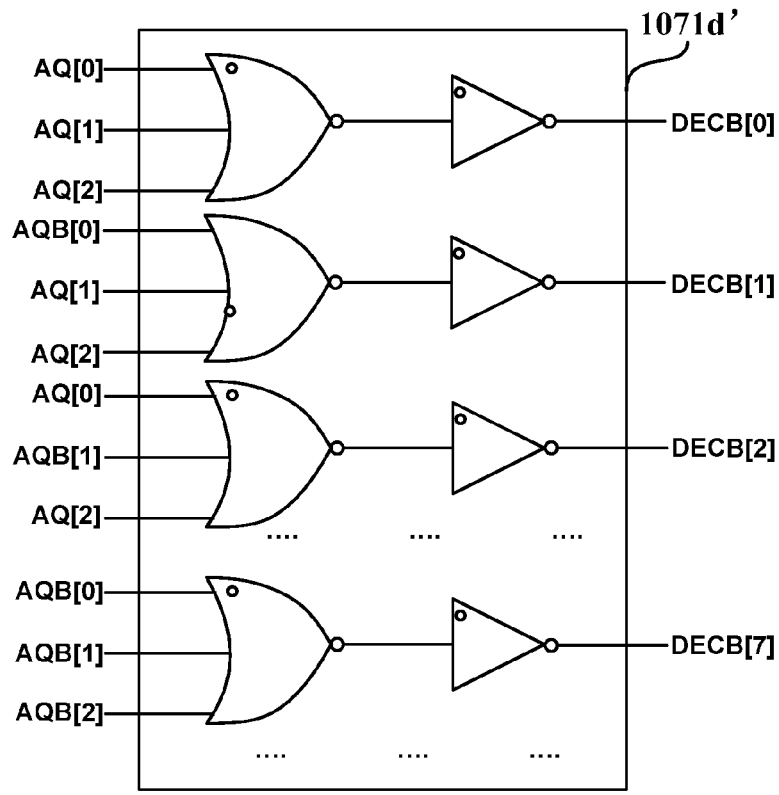
Figure 11:
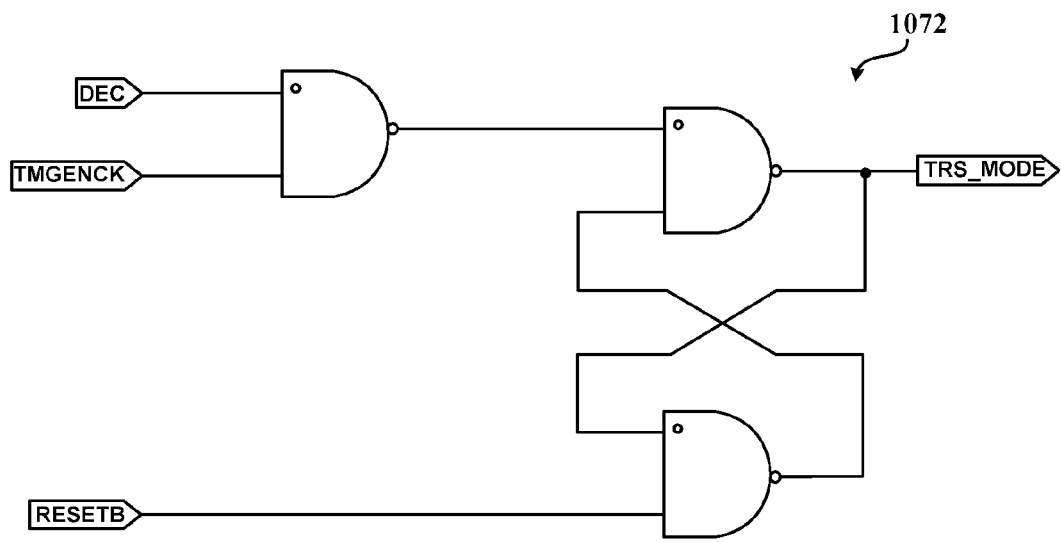
FIG. 11 shows an embodiment of a test mode latch circuit in FIG. 9.
Figure 12:
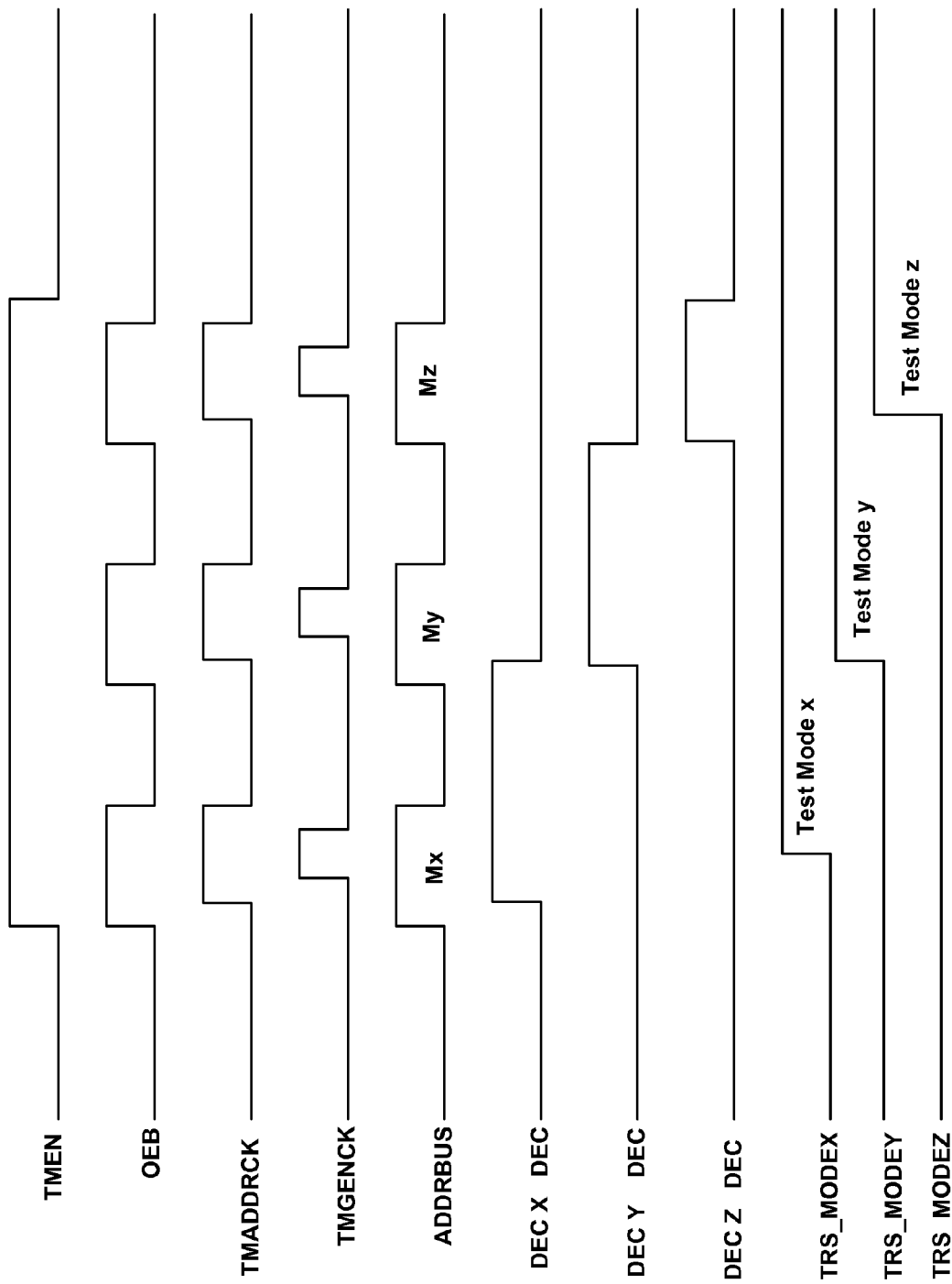
FIG. 12 shows the waveforms of signals of the test mode latch circuit in FIG. 11.
Figure 17:
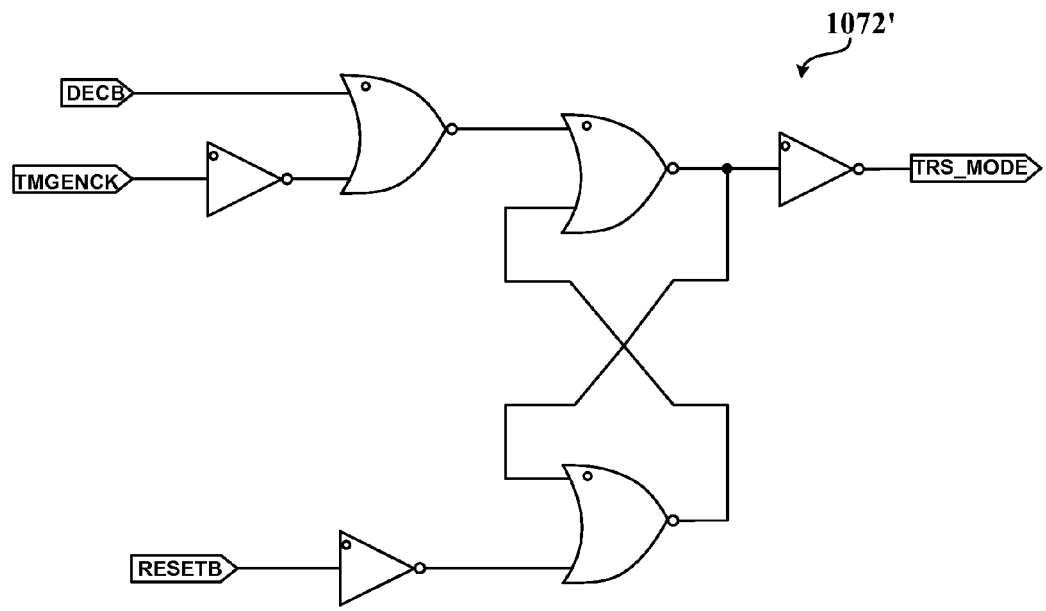
FIG. 17 shows another embodiment of a test mode latch circuit in FIG. 9.

FIGS. 9-11 show a detailed circuit of an embodiment of the test mode decoder 107 in FIG. 1, wherein FIG. 12 shows the waveform of signals of the test mode decoder. FIGS. 10(a)-10(c) show decoding circuits used in the test mode decoder, which are configured to generate specific test patterns according to the clock signal TMADDRCK, the TMEN signal and test codes Mx or My on the address bus. FIG. 10(a) comprises three flip-flops 1071a, 1071b and 1071c (REG0-REG3), and FIGS. 10(b) and 10(c) show two equivalent circuits 1071d and 1071d'. For example, when three address inputs ADDR [0], ADDR[1] and ADDR[2] are used, 8 different test patterns DEC[0] to DEC[7] can be decoded. FIG. 11 shows an embodiment 1072 of a test mode latch circuit in FIG. 9. The test mode latch circuit 1072 is configured to store a control signal TRS_MODE for the specific test patterns decoded by the decoding circuit according to the clock signal TMGENCK and the signal DEC, and to output the control signal TRS_MODE to the tested circuit. The control signal TRS_MODE may be TRS_MODEX, TRS_MODEY or TRS_MODEZ. FIG. 17 shows another embodiment 1072' of the test mode latch circuit.

While the present invention has been described with reference to specific embodiments. In the above circuits, those circuit implemented with NAND gates can be alternatively implemented by NOR gates. Or the positive logic can be replaced by a negative logic. Thus, it will be apparent to those of ordinary skill in the art that changes or improvements may be made to the disclosed embodiments without departing from the spirit and scope of the present application.

What is claimed is:

1. A method for controlling internal test mode entry of an Asynchronous Static Random Access Memory (ASRAM) chip, comprising:
setting an enabling signal for an internal test mode active to start an internal test period, when two or more consecutive falling edges are detected in a second input signal at an output enable pin of the ASRAM chip and address codes inputted via an address bus coupled to the ASRAM chip are detected to match a validation code predefined in the ASRAM chip at each of the two or more consecutive falling edges, and when a first input signal at a write enable pin of the ASRAM chip is at a low level; and
storing a test mode code inputted via the address bus and triggering the ASRAM chip into the internal test mode according to the test mode code at a following rising edge inputted at the output enable pin, when the first input signal at the write enable pin is at the low level.

2. The method of claim 1, further comprising:
setting the enable signal for the internal test mode inactive to close the internal test period when the first input signal at the write enable pin of the ASRAM chip is at a high level.

3. The method of claim 1, wherein the enable signal for the internal test mode has a maximum width being controlled by an internal delay circuit of the ASRAM chip and the first input signal at the write enable pin.

4. The method of claim 1, wherein the ASRAM chip is triggered into different test modes according to different test mode codes during the step of storing the test mode code inputted via the address bus and triggering the ASRAM chip into the internal test mode.

5. The method of claim 1, wherein the address codes inputted via the address bus are defined by the users during the step of setting the enabling signal for the internal test mode active to start the internal test period.

6. The method of claim 1, wherein three consecutive falling edges are inputted at the output enable pin of the ASRAM chip, and a corresponding code is inputted via the address bus at each falling edge during the step of setting the enabling signal for the internal test mode active to start the internal test period.

7. A circuit for controlling internal test mode entry of an ASRAM chip, comprising:
an address code comparator configured to detect whether address codes inputted via an address bus coupled to the ASRAM chip match a predefined validation code;
a test mode detector configured to determine whether to let the ASRAM chip enter into an internal test mode according to a first input signal at a write enable pin of the ASRAM chip, a second input signal at an output enable pin of the ASRAM chip and an output signal of the address code comparator, wherein the ASRAM chip enters into the internal test mode when two or more consecutive falling edges are detected in the second input signal at the output enable pin, and the address codes inputted via the address bus are detected to match the predefined validation code at each of the two or more consecutive falling edges, and when the first input signal at the write enable pin is at a low level;
a test mode clock generator configured to generate a clock signal according to an output signal of the test mode detector and the second input signal at the output enable pin; and
a test mode decoder configured to generate a test control signal according to the output signal of the test mode detector, the clock signal outputted by the test mode clock generator and the address codes inputted via the address bus.

8. The circuit of claim 7, wherein the ASRAM chip enters into the internal test mode when three consecutive falling edges are detected in the second input signal at the output enable pin, and the address codes inputted via the address bus are detected to match the predefined validation code at each of the three falling edges, and when the first input signal at the write enable pin is at the low level.

9. The circuit of claim 7, wherein the test mode detector comprises:
a working clock generating module configured to generate a working clock for the test mode detector according to the first input signal at the write enable pin of the ASRAM chip and the second input signal at the output enable pin of the ASRAM chip;
a detecting module configured to detect whether the address codes inputted via the address bus match the predefined validation code at the two or more consecutive falling edges of the second input signal at the output enable pin according to the output signal of the address code comparator, the working clock outputted by the working clock generating module and the first input signal at the write enable pin of the ASRAM chip;

a test mode entry module configured to generate a test mode entry signal according to an output signal of the detecting module and the first input signal at the write enable pin, and to output a control signal to the working clock generating module to invalidate the subsequent falling edges inputted at the output enable pin of the ASRAM chip; and a test period determining module configured to determine a maximum width of a test period according to the test mode entry signal outputted by the test mode entry module and a selecting signal, and to output an internal test mode enable signal.

10. The circuit of claim 7, wherein the test mode decoder comprises:

a decoding circuit configured to generate a test pattern according to the clock signal outputted by the test mode clock generator, the output signal of the test mode detector and the address codes inputted via the address bus; and a latch circuit configured to store the test pattern decoded by the decoding circuit according to the input signal of the test mode clock generator and the test pattern outputted by the decoding circuit, and to output the test control signal to a tested circuit.

* * * * *